United States Patent [19]

Waehner

[11] 4,216,414
[45] Aug. 5, 1980

[54] ISOLATION TRANSFORMER FOR A MAGNETIC DEFLECTION YOKE

[75] Inventor: Glenn C. Waehner, Riverside, Conn.

[73] Assignee: United Technologies Corporation, Hartford, Conn.

[21] Appl. No.: 972,549

[22] Filed: Dec. 22, 1978

[51] Int. Cl.² .................. H01J 29/70; H01J 29/76
[52] U.S. Cl. ................................ 315/405; 315/388
[58] Field of Search ............. 315/387, 388, 389, 405

[56] References Cited

U.S. PATENT DOCUMENTS

| 2,891,192 | 6/1959 | Goodrich | 315/387 |
| 3,428,855 | 2/1969 | McDonald | 315/388 |
| 3,544,810 | 12/1970 | McDonald et al. | 315/388 X |

*Primary Examiner*—Theodore M. Blum
*Attorney, Agent, or Firm*—Richard P. Lange

[57] ABSTRACT

Each orthogonal driver channel for the magnet deflection yoke of a conventional CRT includes a simple bifilar wound transformer which is connected so that the deflection current waveform passes therethrough. The transformer effectively minimizes the inherent parasitic capacitance between the two windings of the magnetic deflection yoke as it affects a high frequency input signal presented to the input terminal of the high gain operational amplifier. However, the impedance introduced within the feedback loop of the operational amplifier is minimal with respect to an input signal to either driver channel, and thus no significant distortion is presented to the current waveform driving each winding.

8 Claims, 2 Drawing Figures

ISOLATION TRANSFORMER FOR A MAGNETIC DEFLECTION YOKE

BACKGROUND OF THE INVENTION

1. Field of the Invention

This invention relates to a driver circuit configuration used with the magnetic deflection yoke of a typical cathode ray tube and, particularly, to a high speed circuit configuration used in the driver channels for a magnetic deflection type of cathode ray tube.

2. Description of the Prior Art

CRT (cathode ray tube) display devices are well known and have been used for many years to display a visual readout of electrical information derived from a multitude of different sources. A magnetic yoke is often employed to create a magnetomotive force on the beam of electrons emitted by the cathode of the CRT to deflect the beam along two independent axes.

Numerous circuit configurations have been proposed for driving the horizontal and vertical winding of the magnetic deflection yoke. In some applications of a CRT, such as a readout device for displaying alphanumeric characters, it is well known that the band pass characteristic of both the vertical and horizontal drive circuits should be as high as possible to obtain optimum character fidelity, i.e. sharp points and edges of the individual characters.

In many driver circuit configurations, the maximum frequency response of the channel is limited by the resonance of the specific yoke, which in turn is a function of the impedance of that specific yoke. Prior art circuit configurations for driving both the horizontal and vertical deflection winding of the magnetic yoke have included the high gain operational amplifier in which the yoke is connected so that it is in a feedback loop of the operational amplifier. In such a circuit configuration, the upper limit of the band pass characteristic of the channel was limited by the yoke resonance, the compensation therefor was to cause the overall channel to be designed to roll off prior to the resonant point of the yoke. By causing the channel bandwidth to roll of prior to the resonant frequency, instability in the channel is prevented by assuring adequate feedback gain and phase margins.

Of course, as indicated hereinbefore, the lower the frequency at which the channel begins to roll off, the greater the degradation of the characters on the faceplate of the CRT so the rate at which information can be displayed on a CRT is directly related to the band pass of the driver circuitry. Further, a smooth roll off of the band pass ability of the channel associated with a magnetic driver circuit is complicated by the fact that in a typical yoke, a null point often occurs at a frequency slightly above the frequency of primary yoke resonance because of the relationship between the stray capacitance and stray inductance. At this null frequency, the effective impedance of the yoke has changed to a minimum value from the maximum which occurred at the frequency of the primary resonance. This rapid change in impedance further complicates the design of a smooth response at the high end of a yoke driver channel by reducing the feedback gain and phase margins. Even at the frequencies beyond the null frequency, the high Q can cause an impedance change which, if uncompensated for, would allow the system to become unstable or oscillate.

As is known, instability at any frequency of a driver circuit for one of the two orthogonal channels will cause the entire channel to be unsuitable for its intended purpose. The circuit design considerations associated with the high frequency end of the driver channel pose the most significant problems. The horizontal winding and the vertical winding of a magnetic deflection yoke are in close proximity to each other resulting in parasitic capacitance therebetween which impacts the operation of each channel individually. For example, it is known that in a yoke for orthogonal deflection if one winding is connected to a conventional feedback driver circuit so that it is essentially grounded, or at least coupled to ground through a small resistance, the yoke impedance characteristic will have a reasonably sharp resonance point followed by a sharp null point. However, if that same second channel is opened so that it is not connected to ground (not the normal case in operation), the parasitic resonance between the two yoke windings changes thereby improving the overall band pass characteristics of the first channel.

Of interest is U.S. Pat. No. 3,307,067 issued Feb. 28, 1967 to P. L. Jachim et al for DYNAMIC BLUE LATERAL CORRECTION SYSTEM. The beam control apparatus disclosed in this patent includes a first and second inductively coupled winding positioned adjacent the pre-convergence path of the beam providing the blue raster. The first winding is connected in series with the deflection yoke to carry saw tooth deflection current. A variable impedance is connected across the second winding to form a control loop so that induced current flowing therein can be varied to control the net flux produced by the corrector. This disclosure does not appear to be concerned with the bandwidth enhancement of a driver channel for orthogonal windings of a magnetic deflection yoke.

SUMMARY OF THE INVENTION

A primary object of the present invention is to provide a driver circuit for use with an orthogonal magnetic deflection yoke of a conventional CRT in which the adverse effect of parasitic capacitance between the two windings is minimized.

According to the present invention, a simple bifilar wound transformer is positioned in the amplifier circuit driving the windings of an orthogonal yoke of a conventional CRT for improving the system characteristics. The introduction of the transformer into the feedback loop with its two windings on opposite sides of the yoke causes the parasitic coupled signals from the other channel to view a high impedance while the transformer appears as a low impedance in its channel so that it does not distort the signal waveform to be presented to the yoke winding.

Other objects, features and advantages of the present invention will become more apparent in light of the following detailed description of a preferred embodiment as illustrated in the accompanying drawing.

DETAILED DESCRIPTION OF THE ILLUSTRATED EMBODIMENT

Figure 1:
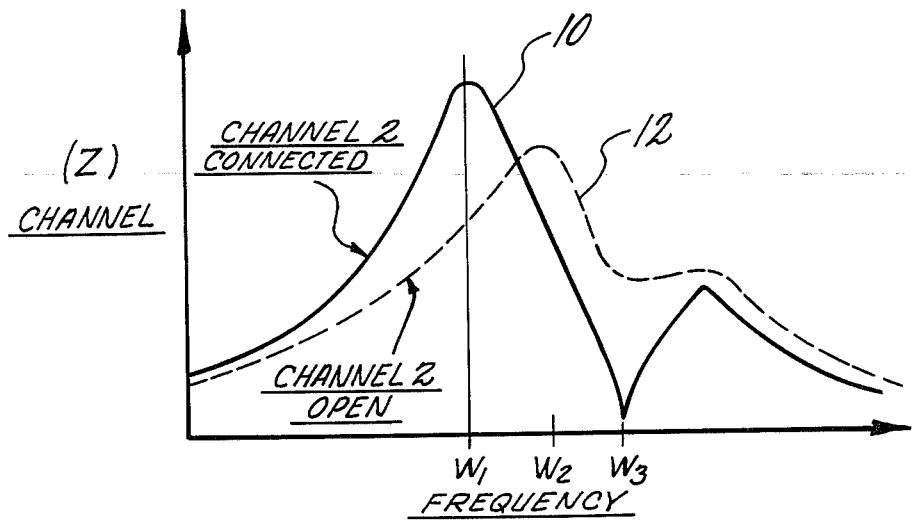
FIG. 1 is a graph representing the impedance of a conventional magnetic deflection yoke versus frequency.

Referring initially to FIG. 1, there is seen a graph of the impedance of one of the two windings of a conventional magnetic deflection yoke. Waveform 10 represents the impedance of one of the two windings of a typical magnetic deflection yoke as a function of frequency with the other winding normally connected in a driver circuit, the normal condition for deflecting the electron beam orthogonally to create a display on the faceplate of the CRT. A typical driver channel for each winding normally includes an operational amplifier in which the magnetic winding is connected in the feedback loop. A resistor with a low resistance value, one ohm, may couple the feedback loop to ground to provide a path for the large magnitude of current from the operational amplifier which is required by the magnetic winding to create a sufficient magnetomotive force for deflection of the electron beam.

As is seen in FIG. 1, waveform 10 demonstrates that the impedance of channel 1 is at a maximum point at $\omega_1$, this point being known as the "primary resonant point". This resonant point occurs when the inductance inherent in the coil resonates with the capacitance inherent in the coil, a part of this capacitance being the stray capacitance associated with coupling between the two windings comprising the magnetic deflection yoke.

As is also seen, at a slightly higher point in the frequency spectrum, $\omega_3$, the magnitude of the winding impedance has dropped to a minimum value of almost zero and this change, i.e. $\omega_1$ to $\omega_3$, is a very high Q condition which, if not properly compensated for, can cause the driver circuit to become unstable and oscillate. Beyond $\omega_3$ second order impedance effects cause other sharp resonance points but the lower magnitude of these points coupled with the higher frequency at which they occur pose a much less stringent design consideration when connected in a feedback loop.

Still referring to FIG. 1, waveform 12 represents the impedance of one of the two windings of a typical magnetic deflection yoke as a function of frequency with the other winding open or not connected in a driver circuit, a nonoperating condition in that the beam of the CRT would only be deflected in one of the two orthogonal directions. However, a significant aspect of the present invention is the recognition of the fact that if the impedance characteristic of the channels could be made to conform to this particular waveform, then it would be much easier to compensate a driver channel to prevent instability. For example, it can be noted that in the open channel case illustrated by waveform 12, the primary resonant point occurs at $\omega_2$ which is higher in frequency than $\omega_1$. In addition, the magnitude of the impedance in the open circuit case at $\omega_2$ is less than the magnitude of the impedance with both channels connected as described hereinbefore with respect to waveform 10. At the first null point of waveform 12 which is just beyond the primary resonant point, at approximately $\omega_3$, the magnitude of the winding impedance is much greater in this case than it was with both windings connected in the driver circuit. As a result, a lower Q condition occurs such that it is easier to design the necessary compensation into this driver circuit to prevent overall channel instability.

Figure 2:
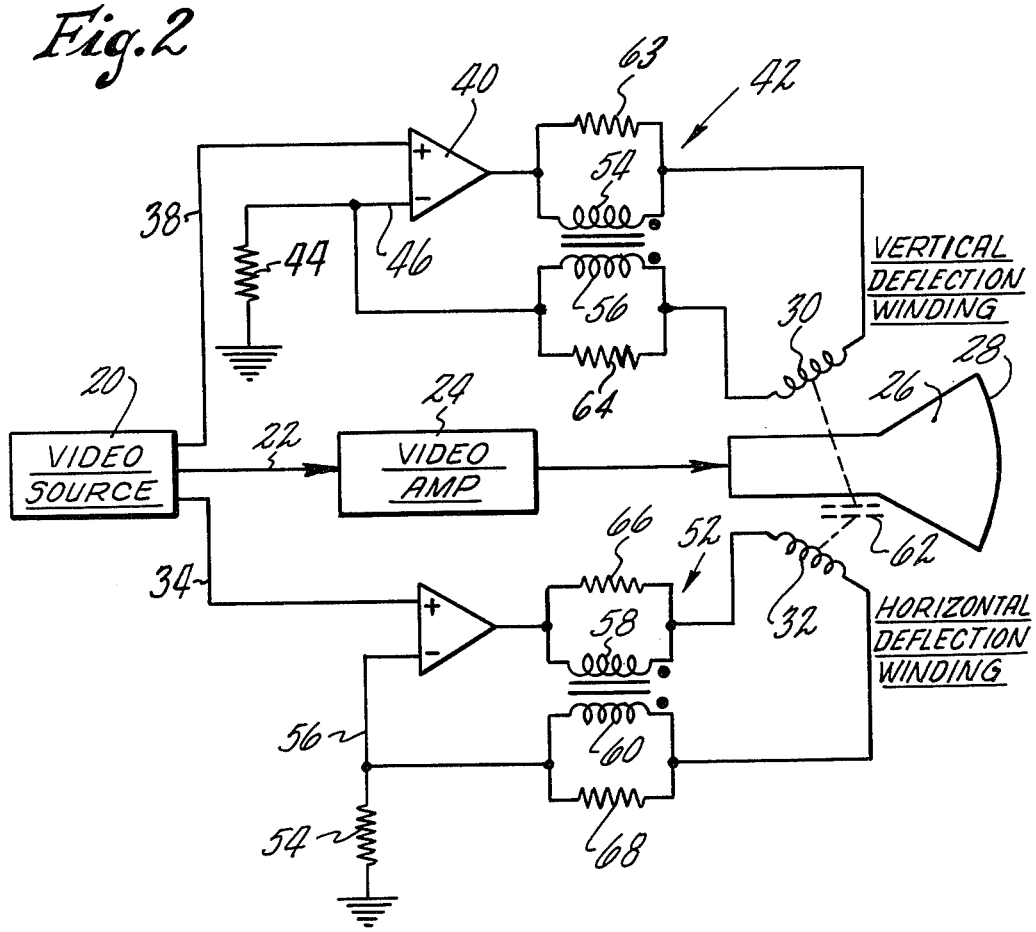
FIG. 2 is one embodiment of a circuit configuration for a driver circuit according to the present invention.

A significant feature of the present invention is to utilize the heretofore identified resonance characteristic of a magnetic deflection yoke when one of the two windings is open, but yet both amplifiers remain connected to the yoke windings, the normal operating condition. Referring now to FIG. 2, a simplified version of a typical video display system employing a CRT is illustrated. A video source 10 is shown and may be one of the many well known devices which have an electrical output signal suitable for display on a CRT. The video source is connected by a line 22 to a video amplifier 24 which amplifies and conditions the video waveform to a level suitable for presentation to the control element of a cathode ray tube 26. The cathode ray tube 26 is of conventional design and includes an electron beam gun at the rear portion of the neck which emits a beam of electrons which ultimately impinge the faceplate 28 at the opposite end of the CRT. A magnetic deflection yoke is positioned adjacent the neck of the CRT and includes a vertical deflection coil 30 and horizontal deflection coil 32 for deflecting the electron beam orthogonally across the faceplate of the CRT.

Still referring to FIG. 2, the video source 20 generates deflection information and presents it via line 34 to a horizontal channel and via line 38 to a vertical deflection channel. The horizontal and vertical deflection channels of the present invention are essentially identical but it should be understood that in some applications identical response characteristics from both channels may not be required and thus the value of the circuit components may vary. Vertical information is presented to the positive input of a high gain operational amplifier 40. The output of the amplifier 40 is presented through a transformer 42, described in greater detail hereinafter, to one side of the vertical deflection winding 30. The other side of the vertical deflection winding 30 is connected through the transformer 42 to one side of a yoke resistor 44, the other side of which is coupled to ground. The voltage waveform across the yoke resistor 44 is fed back via a line 46 to the negative input terminal of the operational amplifier 40.

Now considering the horizontal deflection channel, the video source 20 also generates horizontal information and presents it via line 34 to the positive input of the high gain operational amplifier 50. The output of the amplifier 50 is presented through a transformer 52, described in greater detail hereinafter to one side of the horizontal deflection winding 32. The other side of the horizontal deflection winding 32 is connected through the transformer 52 to one side of a yoke resistor 54, the other side of which is coupled to ground. The voltage waveform across the yoke resistor 54 is fed back via a line 56 to the negative input terminal of the operational amplifier 50. This configuration, but for the transformers 42 and 52, is a well known method of providing the high current waveform required to create a magnetomotive force of sufficient magnitude for deflection of the electron beam.

According to the present invention, the orthogonal driver channels include a transformer connected to each winding of the magnetic deflection yoke to pass differential deflection signals, but which rejects high frequency common mode signals from the other channel thereby effectively eliminating interaction between the two channels that would be caused by inherent parasitic capacitance within the magnetic deflection yoke. Referring now to FIG. 1 in addition to FIG. 2, the operation of the driver channels which include the transformers 42 and 52 will now be described. The transformer 42 includes a winding 54 which is connected between the output of the operational amplifier 40 and the top of the vertical deflection coil 30. The other winding 56, to which winding 54 is mutually coupled, is connected between the bottom of the vertical deflection coil 30 and the yoke resistor 44. In a similar manner, in the horizontal drive channel, the transformer 52 includes a winding 58 which is connected between the output of the operational amplifier 50 and the top of the horizontal deflection coil 32. The other winding 60, mutually coupled to winding 58, is connected between the bottom of the horizontal deflection coil 32 and the yoke resistor 54.

It can be noted that the parasitic capacitance, illustrated in FIG. 2 as capacitor 62, is essentially an inherent characteristic of a yoke which has a winding disposed adjacent each other and can be considered as a capacitor between the vertical deflection winding 30 and the horizontal deflection winding 32. Without either transformer 42 or 52 in the circuit, each channel is essentially coupled to ground through the parasitic capacitor 62 and the yoke resistor 54, in that the value of this resistance is low. It has been recognized that the effect of the parasitic capacitor 62 is to contribute to the capacitance defining the resonant frequency of both the horizontal and vertical driver channels. If the effect of the parasitic capacitor 62 could be isolated, or at least minimized, then the resonant frequency defining the bandwidth and hence the speed of that channel to a high frequency input signal would be enhanced. Accordingly, the present invention introduces a large AC impedance between the bottom of each deflection coil and its respective yoke resistance and the top of each coil and its amplifier which in effect isolates the yoke from an AC ground removing the effect of the parasitic capacitor, i.e. the channel appears as an open circuit at high frequency. However, to a deflection signal which is an input presented to the horizontal or vertical driver channel, the mutual coupling between the two windings of each transformer cause the deflection signal with the feedback loop to be unaffected. This occurs because each transformer appears as a low impedance which minimally affects the waveforms within its channel.

A particular feature of the present invention is that the transformer employed in each deflection channel can be a simple low cost type such as a few turns of wire bifilar wound on a small pot core or toroid. This transformer configuration would be well suited to a driver circuit configuration in which the high frequency end of the channel bandwidth response was the primary spectrum of interest, e.g. an alphanumeric display system which must operate at a high speed when acting as a computer readout, or the like. In the event that the driver channel was designed to operate at a lower frequency and the yoke resonance was still the limiting parameter, the impedance of the transformer to operate in the lower frequency range can be increased by adding more turns around the core or utilizing a core with a higher permeability to create the heretofore described blocking impedance in the frequency range of interest. In any event, each transformer is connected as a Balun type so that common mode signals from the other channel are rejected while the desired signals within a channel are unaffected.

Depending on the exact frequency range in which the driver channels are operating, the parasitic capacitance between the windings in each channel, that is the winding 54 and the winding 56 of transformer 42 or the winding 58 and the winding 60 of transformer 52 in FIG. 2, may cause a ringing within the feedback loop.

To damp out this ringing, a resistor 63 and a resistor 64 can be provided to shunt the windings 54 and 56, respectively. In a similar manner, a resistor 66 and a resistor 68 can be provided to shunt the winding 58 and the winding 60, respectively, to damp out any ringing in the horizontal deflection channel. Each resistor may be in the range of 100 ohms and provides a pathway at very high frequencies around each winding where the impedance of the winding is greater and may affect the higher order harmonics of the waveform of the deflection signal presented to the yoke winding. However, at low frequencies, the effective impedance of the transformer to signals within that range is so low that it does not appreciably affect the signal fed back to the operational amplifier. In any event, the value of this resistor has to be sufficiently large so that it does not reintroduce a null, such as the null in waveform 10 at $\omega_3$ illustrated in FIG. 1. A null could occur if the AC impedance of the transformer is effectively shorted by one of these shunting resistors.

It should also be understood that only one transformer could be incorporated into one of the two driver channels for the windings of the deflection yoke. This is because the introduction of a transformer in either channel effectively adds a high impedance in series with the parasitic capacitor 62. Referring to FIG. 2, it can be observed that an impedance on either side of the capacitor 62 is a series impedance which isolates the parasitic coupling between the channels. Although one transformer in either driver-channel will work as heretofore described to minimize the degrading effect of the parasitic capicitance, the two transformer configuration has the advantage of allowing the two channels to be manufactured in an identical fashion which typically results in lower manufacturing cost.

Although the invention has been shown and described with respect to the preferred embodiment thereof, it should be understood by those skilled in the art that various changes and omissions in the form and detail thereof may be made therein without departing from the spirit and the scope of the invention.

Having thus described typical embodiments of my invention, that which I claim as new and desire to secure by Letters Patent of the United States is:

1. A driver circuit for use with a magnetic deflection yoke of a CRT, said magnetic deflection yoke having at least two windings which may include some parasitic capacitance therebetween, comprising:

operational amplifier means having an input for receiving a deflection signal, and including an output for presenting an amplified signal waveform to one side of one winding of said magnetic deflection yoke;

sense resistor means connected to the other side of said one winding for coupling said deflection signal waveforms to ground;

a feedback means for presenting the signal waveform across said sense resistor means to said input of said operational amplifier; and means for introducing an impedance in series with said parasitic capacitance which, at high frequency, acts as a high impedance, whereby the effective resonant frequency of said yoke is changed enhancing the overall bandwidth of said driver circuit and reducing the depth of the null associated with said resonance.

2. A driver circuit according to claim 1, wherein said feedback means is a part of a feedback loop, and wherein said means for introducing a high operational impedance is a transformer positioned in said feedback loop.

3. A driver circuit according to claim 2, wherein said transformer includes a first winding positioned between the output of said operational amplifier and one side of said one winding of said magnetic deflection yoke, and also includes a second winding positioned between the other side of said one winding and said sense resistor means, said two windings being inductively coupled.

4. A driver circuit according to claim 1, wherein one of said windings of said magnetic deflection yoke is positioned to deflect an electron beam within said CRT vertically, while the other of said windings is positioned to deflect the electron beam of said CRT horizontally, and wherein a transformer is positioned in the feedback loop of one of said driver channels to add a high operational impedance in series with any parasitic capacitance between said two windings.

5. A driver circuit according to claim 4, wherein there is a transformer positioned in the feedback loop of the driver circuit for each of said windings.

6. A driver circuit according to claim 3, wherein said first and second winding of said transformer has a shunting resistor thereacross.

7. A driver circuit according to claim 4, wherein said transformer comprises a few turns of wire bifilar wound on a pot core.

8. A driver circuit according to claim 4, wherein said transformer is a few turns of wire bifilar wound on a toroid core.

* * * * *